US011282584B2

United States Patent
Lee

(10) Patent No.: US 11,282,584 B2
(45) Date of Patent: Mar. 22, 2022

(54) MULTI-CHIP PACKAGE AND METHOD OF TESTING THE SAME

(71) Applicant: SK hynix Inc., Gyeonggi-do (KR)

(72) Inventor: Seung Yeol Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/000,577

(22) Filed: Aug. 24, 2020

(65) Prior Publication Data
US 2021/0304836 A1    Sep. 30, 2021

(30) Foreign Application Priority Data

Mar. 25, 2020   (KR) .................. 10-2020-0036077

(51) Int. Cl.
| | |
|---|---|
| *G11C 29/36* | (2006.01) |
| *G11C 29/44* | (2006.01) |
| *G11C 29/10* | (2006.01) |
| *G11C 7/10* | (2006.01) |
| *G11C 29/14* | (2006.01) |
| *G11C 29/12* | (2006.01) |

(52) U.S. Cl.
CPC ............ *G11C 29/36* (2013.01); *G11C 7/1057* (2013.01); *G11C 7/1084* (2013.01); *G11C 29/10* (2013.01); *G11C 29/14* (2013.01); *G11C 29/44* (2013.01); *G11C 2029/1206* (2013.01); *G11C 2029/3602* (2013.01)

(58) Field of Classification Search
CPC ..... G11C 29/36; G11C 7/1057; G11C 7/1084; G11C 29/10; G11C 29/14; G11C 29/44; G11C 2029/1206; G11C 2029/3602
See application file for complete search history.

(56) References Cited

U.S. PATENT DOCUMENTS

| | | | | |
|---|---|---|---|---|
| 6,715,067 | B1 * | 3/2004 | Rhoads | G06F 3/0644 |
| | | | | 713/1 |
| 7,424,659 | B2 * | 9/2008 | Avraham | G11C 29/1201 |
| | | | | 714/718 |
| 7,982,217 | B2 * | 7/2011 | Sugita | G01R 31/31926 |
| | | | | 257/48 |
| 8,693,271 | B2 * | 4/2014 | Raval | G11C 29/06 |
| | | | | 365/201 |
| 9,355,719 | B2 * | 5/2016 | Miura | G11C 13/0061 |
| 2005/0024977 | A1 * | 2/2005 | Ong | G11C 29/1201 |
| | | | | 365/232 |
| 2009/0217111 | A1 * | 8/2009 | Ito | G11C 29/56 |
| | | | | 714/718 |
| 2014/0281316 | A1 * | 9/2014 | Sano | G06F 11/1441 |
| | | | | 711/162 |
| 2019/0279734 | A1 | 9/2019 | Kang | |
| 2019/0311775 | A1 | 10/2019 | Kwon | |
| 2021/0208810 | A1 * | 7/2021 | Manohar | G06F 3/0653 |

FOREIGN PATENT DOCUMENTS

| | | |
|---|---|---|
| KR | 10-2008-0021972 | 3/2008 |
| KR | 10-1088588 | 12/2011 |

* cited by examiner

*Primary Examiner* — Vanthu T Nguyen
(74) *Attorney, Agent, or Firm* — IP & T Group LLP

(57) ABSTRACT

A multi-chip package may include a controller, a storage memory and a buffer memory. The controller may be configured to output a control signal. The storage memory may be tested in response to the control signal. The buffer memory may be sequentially tested while or after testing the storage memory in response to the control signal.

21 Claims, 11 Drawing Sheets

MULTI-CHIP PACKAGE AND METHOD OF TESTING THE SAME

CROSS-REFERENCE TO RELATED APPLICATION

The present application claims priority under 35 U.S.C. § 119(a) to Korean application number 10-2020-0036077, filed on Mar. 25, 2020, in the Korean Intellectual Property Office, which is incorporated herein by reference in its entirety.

BACKGROUND

1. Technical Field

Various embodiments generally relate to a data storage system and a method of driving the same, more particularly, a multi-chip package and a method of testing the multi-chip package.

2. Related Art

Recently, a data storage system such as a computer system, a mobile device, etc., may use a volatile memory having a rapid data-processing speed as a buffer memory or a main memory and a non-volatile memory such as a hard disk drive, a flash memory, etc., as a storage memory.

A large quantity of data may be written to, and read from, the non-volatile storage memory. Data may be temporarily stored in the volatile buffer memory.

Recently, the data storage system including the non-volatile memory and the volatile memory may be packaged in a multi-chip package together with a controller. The multi-chip package may be tested before being mounted on a module such as a DIMM or in a package state.

Generally, the storage memory and the buffer memory in the multi-chip package may be tested by an individual test scheme. In contrast, because most errors of the multi-chip package may be generated in simultaneously operating the storage memory and the buffer memory, the individual test operation may not sufficiently ensure against failure of the multi-chip package in an actual user environment.

SUMMARY

In embodiments of the present disclosure, a multi-chip package may include a controller, a storage memory and a buffer memory. The controller may be configured to output a control signal. The storage memory may be tested in response to the control signal. The buffer memory may be sequentially tested while or after testing the storage memory in response to the control signal.

In embodiments of the present disclosure, according to a method of testing a multi-chip package, a storage memory configured to store data may be tested in response to a control signal. A valid memory region of a buffer memory configured to temporarily store the data may be determined in response to the control signal. The valid memory region of the buffer memory may be tested in an enable section of the control signal.

In embodiments of the present disclosure, a multi-chip package may include a controller, a storage memory and a buffer memory. The controller may be configured to provide the storage memory and the buffer memory with an enabled control signal for testing the storage memory and a valid memory region of the buffer memory in operating the storage memory and the buffer memory. The controller may be configured to disable the control signal after testing the storage memory and the valid memory region of the buffer memory.

In embodiments of the present disclosure, an operating method of a memory system comprising testing, in series or in parallel, a non-volatile memory device and a volatile memory device of the memory system according to a single trigger signal issued by a controller of the memory system. The testing includes testing a valid region of the volatile memory device.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention are described in greater detail with reference to the accompanying drawings. The drawings are schematic illustrations of various embodiments (and intermediate structures). However, the present invention should not be construed as being limited to the particular configurations illustrated herein but may include alternate configurations which do not depart from the spirit and scope of the present invention as defined in the appended claims.

The present invention is also not limited by or to any particular disclosed embodiment nor any particular detail described herein. Although a few embodiments of the present invention are disclosed, it will be appreciated by those of ordinary skill in the art that changes may be made in any of these embodiments without departing from the principles and spirit of the present invention. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
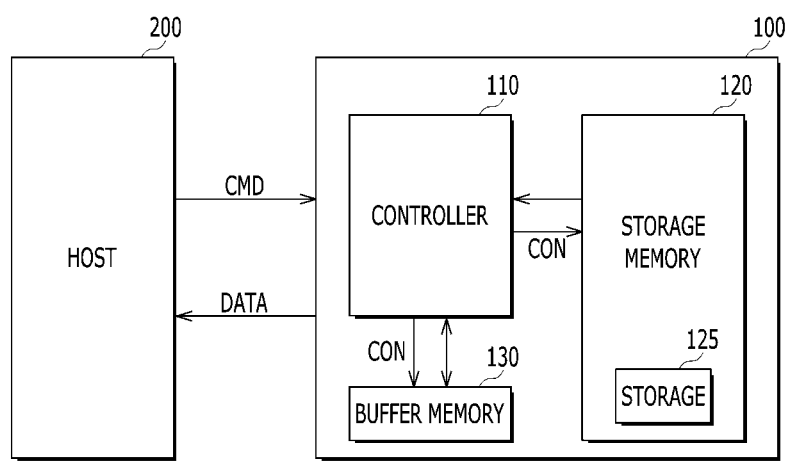
FIG. 1 is a block diagram illustrating a data storage system in accordance with embodiments.
Figure 2:
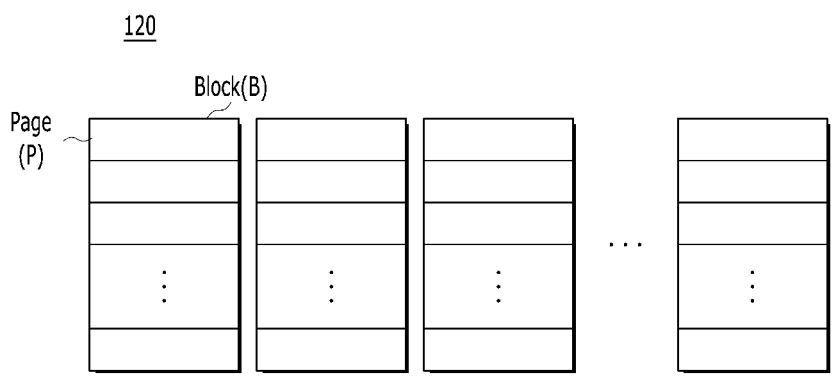
FIG. 2 is a block diagram illustrating a storage memory in accordance with embodiments.

FIG. 1 is a block diagram illustrating a data storage system in accordance with embodiments, and FIG. 2 is a block diagram illustrating a storage memory in accordance with embodiments.

Referring to FIG. 1, a data-processing system 10 may include a multi-chip package 100 and a host 200.

The multi-chip package 100 may communicate with the host 200 through any of various interfaces. The host 200 may provide the multi-chip package 100 with a command CMD to request processing operations of data DATA such as a read operation of the data, a write operation of the data, etc. The host 200 may correspond to a CPU, a processor, a microprocessor, an application processor (AP), etc. Thus, the host 200 may be embodied as a system-on-chip (SOC).

The multi-chip package 100 and the host 200 may interface with each other using an advanced technology attachment (ATA), a serial ATA (SATA), an external SATA (e-SATA), a small computer system interface (SCSI), a serial attached SCSI (SAS), a peripheral component interconnection (PCI), a PCI express (PCI-E), IEEE1394, a universal serial bus (USB), a secure digital (SD) card, a multimedia card (MMC), an embedded multimedia card (eMMC), a compact flash (CF) card, etc.

The multi-chip package 100 may include a controller 110, a storage memory 120 and a buffer memory 130.

The controller 110 may be configured to control operations of the multi-chip package 100. Further, the controller 110 may be configured to control memory operations of the storage memory 120. The controller 100 may simultaneously provide the storage memory 120 and the buffer memory 130 with a control signal CON to control operations of the storage memory 120 and the buffer memory 130. For example, the control signal CON may include a test mode signal, a power-up signal, etc.

For example, the storage memory 120 may include a non-volatile memory device. As is well known, a non-volatile memory device may maintain stored data even when no power is supplied to the non-volatile memory device. The non-volatile memory device may store data provided from the host 200 by the write operation. The non-volatile memory device may also provide the host 200 with the stored data by the read operation.

Referring to FIG. 2, the storage memory 120 may include a plurality of memory blocks B. Each of the memory blocks B may include a plurality of pages P. For example, the pages P may include a plurality of flash memory cells. In various embodiments, the storage memory 120 may include a flash memory. Alternatively, the storage memory 120 may include any of various resistive memories. For example, the storage memory 120 may include a two-dimensional memory cell array or a three-dimensional memory cell array. Further, the storage memory 120 may further include a storage 125 configured to store test results.

The buffer memory 130 may be configured to temporarily store data in the write operation and the read operation of the data by the storage memory 120. For example, the buffer memory 130 may be configured to buffer user data such as write data and read data. The buffer memory 130 may include a portion configured to temporarily store the write data and a different portion configured to temporarily store the read data. Further, the buffer memory 130 may be configured to store information related to driving the storage memory 120. In embodiments, the buffer memory 130 may include a DRAM. Alternatively, the buffer memory 130 may include an SRAM.

Figure 3:
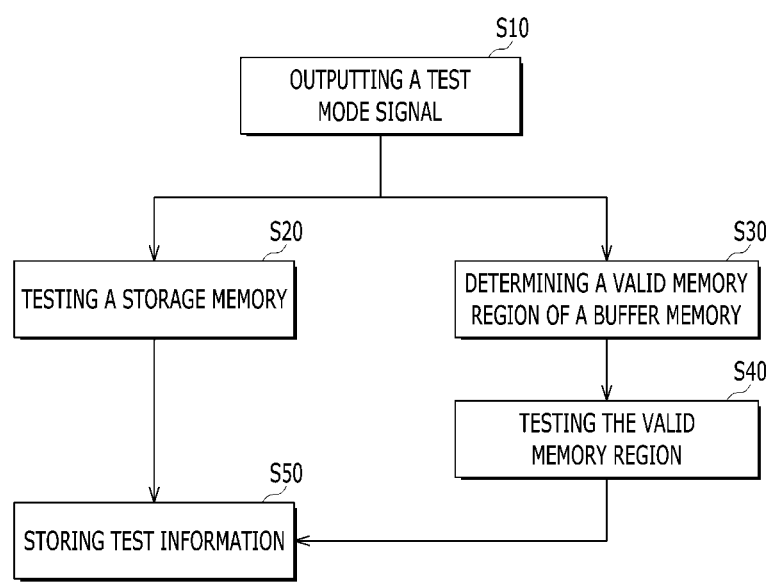
FIGS. 3 and 4 are flow charts illustrating a method of testing a semiconductor device in accordance with an embodiment.
Figure 4:
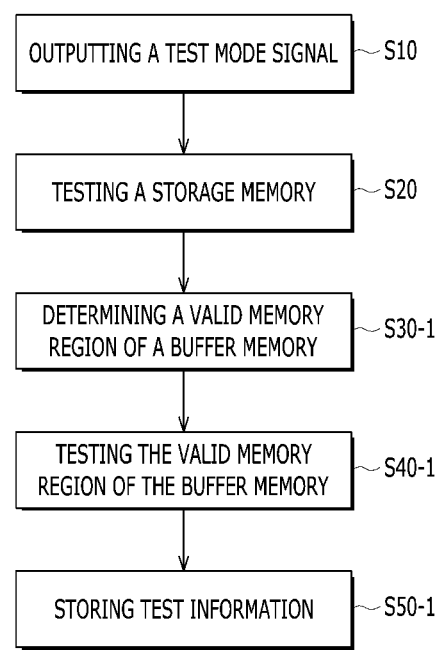

FIGS. 3 and 4 are flow charts illustrating a method of testing a semiconductor device in accordance with an embodiment. In an embodiment, a test mode signal TM may be used as the control signal.

Referring to FIGS. 3 and 4, in operation S10, the controller 110 may output the test mode signal TM to the storage memory 120 and the buffer memory 130.

In operation S20, a test operation may be performed on the storage memory 120 in response to the test mode signal TM. For example, the test operation on the storage memory 120 may include read/write tests of a memory cell.

In operations S30 and S30-1, a valid memory region of the buffer memory 130 may be determined during or just after the test operation on the storage memory 120 in operation S20. The valid memory region may be represented by information indicating the position(s) of memory cell(s) of the buffer memory 130 where no data is stored. The valid memory region of the buffer memory 130 may be determined by firmware or an algorithm stored in the buffer memory 130.

Alternatively, the valid memory region of the buffer memory 130 may be determined by a control circuit in the buffer memory 130. For example, the control circuit may monitor a memory region of the buffer memory 130 to determine the valid memory region through a time at which a response message, corresponding to a write command received from the host 200, is output.

When the valid memory region of the buffer memory 130 is determined in operations S30 and S30-1, in operations S40 and S40-1, the valid memory region of the buffer memory 130 may be tested. The testing of the valid memory region of the buffer memory 130 in operations S40 and S40-1 may be performed during testing the storage memory 120 or sequentially in testing the storage memory 120.

In operations S50 and S50-1, test results of the storage memory 120 and the buffer memory 130 may be stored in the storage 125 of the storage memory 120.

When the test mode signal TM is disabled, the buffer memory 130 may temporarily store the data in the tested valid memory region.

Figure 5:
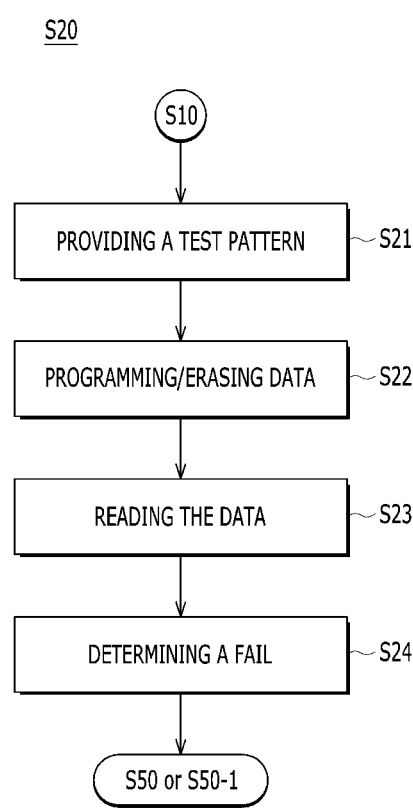
FIG. 5 is a flow chart illustrating a method of testing a storage memory in accordance with an embodiment.

FIG. 5 is a flow chart illustrating a method of testing a storage memory in accordance with an embodiment.

Referring to FIG. 5, when the enabled test mode signal TM may be inputted into the storage memory 120, in operation S21, a tester may provide the storage memory 120 with a test pattern.

In operation S22, data may be programmed in memory cell(s) of the storage memory 120 or programmed data in the storage memory 120 may be erased in accordance with the test pattern.

In operation S23, the programmed or erased data of the memory cell(s) may be read in accordance with the test pattern.

In operation S24, failed memory cell(s) may be determined based on the read data.

In operation S50 or S50-1, fail information indicating which memory cells failed and their respective locations, i.e., the test result may be stored in the storage 125 of the storage memory 120.

However, the present invention is not restricted to FIG. 5, as various other test operations may be performed on the non-volatile memory device at a package level. The test operations of the non-volatile memory device are disclosed in US 2019/0311775 and US 2019/279734, which are incorporated herein by reference in its entirety.

Figure 6:
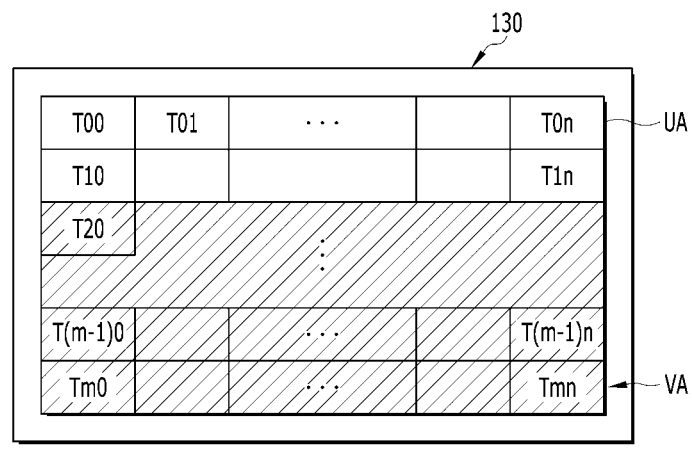
FIG. 6 is a plan view illustrating a cell array of a buffer memory in accordance with an embodiment.

FIG. 6 is a plan view illustrating a cell array of a buffer memory in accordance with an embodiment.

Referring to FIG. 6, the buffer memory 130 may include a memory cell array 130a having a plurality of memory cells. The memory cell array 130a may be divided into a plurality of test regions T01~Tmn based on how many unit tests are to be performed. The number of test regions T01~Tmn is not fixed; rather, such number may be based on a capacity of the memory cell array 130a and how many unit tests are to be performed. In FIG. 6, UA may represent a region on which the memory operation is performed, for example, a region in which the data is temporarily stored. VA may represent a region on which the memory operation is not performed, for example, the valid memory region in which no data is stored.

The test of the buffer memory 130 in operation S40 may be sequentially performed on the valid memory region VA of the buffer memory 130.

Figure 7:
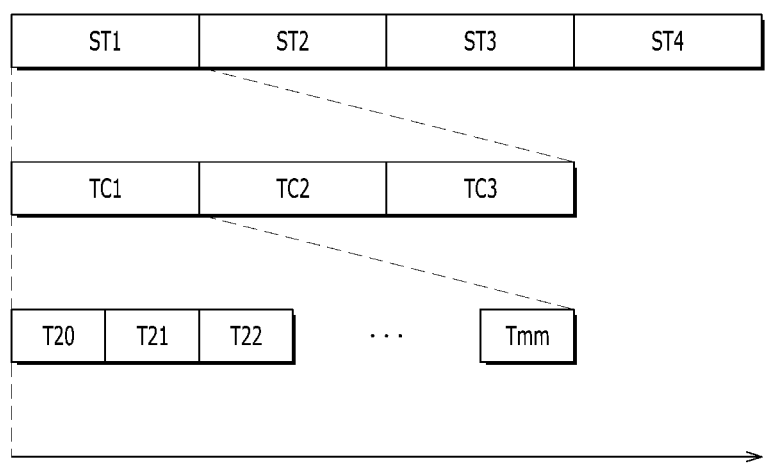
FIG. 7 is a view illustrating a test operation of a buffer memory in accordance with an embodiment.

FIG. 7 is a view illustrating a test operation of a buffer memory in accordance with an embodiment.

Referring to FIG. 7, a test process may be performed on each of the test regions T20~Tmn of the valid memory region VA under at least one test operation ST1~ST4 and at least one test condition TC1~TC3.

For example, the test process may be sequentially performed on the unit test regions T20~Tmn. Alternatively, the test process may be performed on all of the test regions T20~Tmn at the same time.

For example, the first test operation ST1 may be performed on the selected test region(s), e.g., T20, of the valid memory region VA. The first test operation ST1 may be performed under the first test condition TC1. Generally, each test condition represents a different environment in terms of severity. Further, the first test operation ST1 may be performed under the first test condition TC1, the second test condition, and the third test condition TC3, the environments of which increase in severity from TC1 to TC3. After performing the first test operation ST1 on the test region T20 under various test conditions, e.g., TC1 to TC3, the second test operation ST2 may be performed on T20 under the various test conditions TC1~TC3. In an embodiment, the first test operation ST1 may include a self-refresh test, a diagnosis program of an operating system (OS), and/or a row hammering. The second test operation ST2 may include a frequency test. The third test operation ST3 may include a DC parameter test. The fourth test operation ST4 may include an AC parameter test. This testing process continues for each test region. That is, each of the multiple test operations, e.g., ST1 to ST3, is performed under the different conditions, e.g., TC1 to TC3.

According to embodiments, the storage memory 120 and the buffer memory 130 of the multi-chip package 100 may be simultaneously or sequentially tested in response to the same test mode signal TM. Thus, the test process may be performed on the storage memory 120 and the buffer memory 130 under the environment substantially similar to an actual environment to improve test efficiency.

Generally, the storage memory 120 and the buffer memory 130 of the multi-chip package 100 may be individually tested, because the storage memory 120 and the buffer memory 130 are composed of different devices. That is, because the test of the buffer memory 130 may be performed in an idle state of the storage memory 120, deteriorations of the buffer memory 130 may not be accurately tested during the storage memory 120 may be operated.

In another embodiment, the buffer memory 130 may be tested simultaneously or sequentially with the test of the storage memory 120 to improve the test efficiency of the multi-chip package 100.

Figure 8:
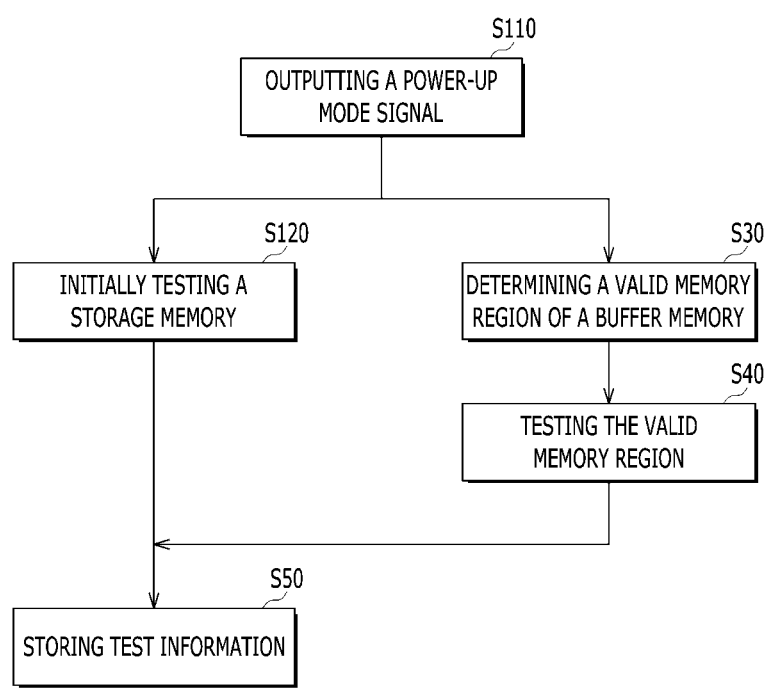
FIGS. 8 and 9 are flow charts illustrating a method of testing a semiconductor device in accordance with an embodiment.
Figure 9:
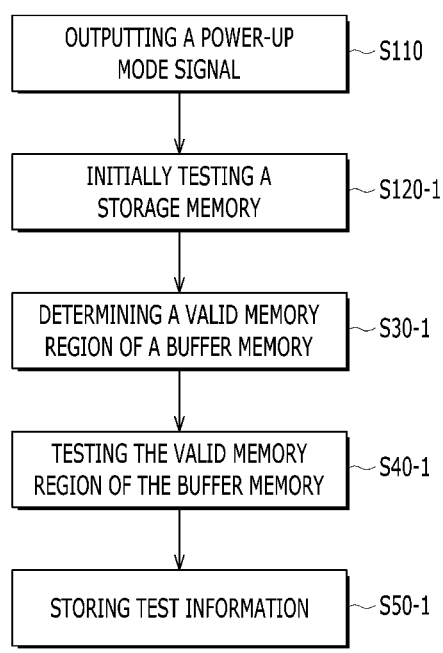

FIGS. 8 and 9 are flow charts illustrating a method of testing a semiconductor device in accordance with an embodiment. In an embodiment, a power-up signal may be used as the control signal.

Referring to FIGS. 8 and 9, in operation S110, the controller 110 may output a power-up mode signal or a power-on reset signal for booting the multi-chip package 100.

As is well known, when the power-up mode signal is generated, the storage memory 120 and the buffer memory 130 may perform initialization operations.

In operation S120, the storage memory 120 may perform an initial test operation, for example, a Linux kernel test operation with the initialization operation, as is well known.

In operations S30 and S30-1, the buffer memory 130 may determine the valid memory region, i.e., the position(s) of the memory cell(s) in which no data is stored during or just after the initial test operation of the storage memory 120.

When the valid memory region of the buffer memory 130 is determined in operations S30 and S30-1, the valid memory region of the buffer memory 130 may be tested in operations S40 and S40-1. The test of the valid memory region of the buffer memory 130 may be performed during the test of the storage memory 120 or sequentially performed after the test of the storage memory 120. The test of the valid memory region of the buffer memory 130 may be substantially the same as the test illustrated with reference to FIG. 7.

The test results of the storage memory 120 and the buffer memory 130 may be stored in the storage 124 of the storage memory 120 in operations S50 and S50-1.

According to embodiment, the storage memory 120 and the buffer memory 130 may be simultaneously or sequentially tested upon booting the semiconductor device, except during a enable section of the test mode, so that the performance of the semiconductor device may be accurately tested. Here, the enable section of the test mode means a period during which the test mode signal TM is enabled (or activated).

Figure 10:
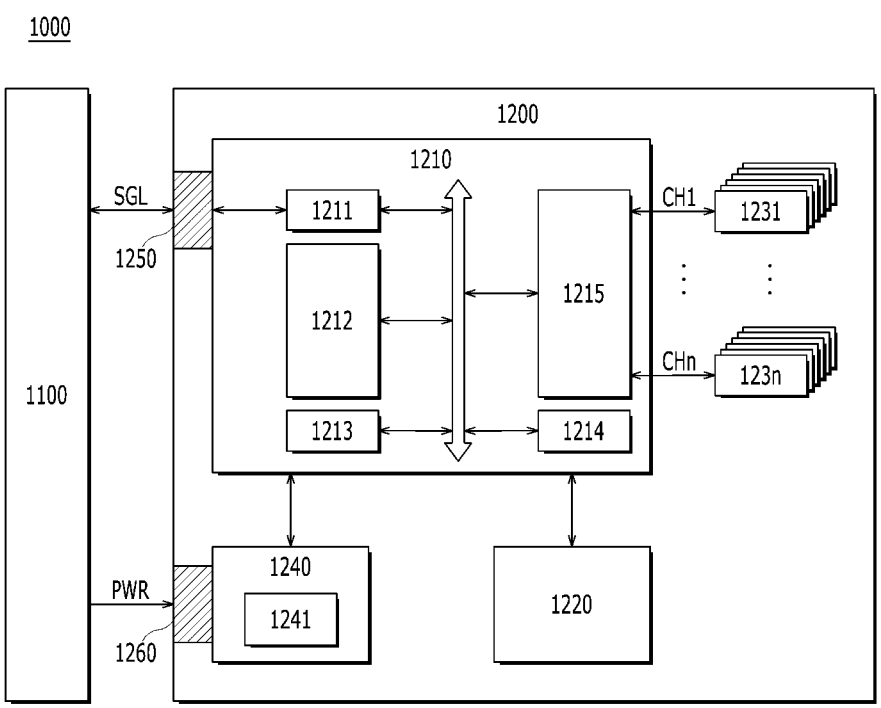
FIG. 10 is a view illustrating a data processing system including a solid state drive (SSD) in accordance with embodiments.

FIG. 10 is a view illustrating a data processing system including a solid state drive (SSD) in accordance with embodiments.

Referring to FIG. 10, a data-processing system 1000 may include a host device 1100 and a solid state drive (SSD) 1200.

The SSD 1200 may include a controller 1210, a buffer memory device 1220, storage memories 1231~123n, a power supply 1240, a signal connector 1250 and a power connector 1260.

The controller 1210 may be configured to control operations of the SSD 1200. The controller 1210 may include a host interface 1211, a control component 1212, a random access memory 1213, an error correction code (ECC) component 1214 and a memory interface 1215.

The host interface 1211 may exchange signals SGL with the host device 1100 through the signal connector 1250. The signals SGL may include a command, an address, data, and the like. The host interface 1211 may be configured to interface the host device 1100 and the SSD 1200 in accordance with a protocol of the host device. For example, the host interface 1211 may interface with the host device 1100 through any one of standard interface protocols, such as an advanced technology attachment (ATA), a serial ATA (SATA), an external SATA (e-SATA), a small computer system interface (SCSI), a serial attached SCSI (SAS), a peripheral component interconnection (PCI), a PCI express (PCI-e or PCIe), IEEE1394, a universal serial bus (USB), a secure digital (SD) card, a multimedia card (MMC), an embedded multimedia card (eMMC), and/or a compact flash (CF) card.

The control component 1212 may be configured to analyze and process the signal SGL inputted from the host device 1100. The control component 1212 may be configured to control background function blocks in accordance with firmware or software for driving the SSD 1200. The random access memory 1213 may be used as an operational memory for driving the firmware or the software.

The ECC component 1214 may be configured to generate parity data of the data transmitted to the storage memories 1231~123n. The generated parity data and the data may be stored in the storage memories 1231~123n. The ECC component 1214 may detect error(s) in the data read from the storage memories 1231~123n based on the parity data. When the number of detected errors is within a correctable range, the ECC component 1214 may correct the detected errors.

The memory interface 1215 may provide the storage memories 1231~123n with control signals such as the command, the address, and the like, in accordance with the controls of the control component 1212. The memory interface 1215 may data with the storage memories 1231~123n in accordance with the controls of the control component 1212. For example, the memory interface 1215 may provide the storage memories 1231~123n with the data stored in the buffer memory device 1220 or the buffer memory device 1220 with the data read from the storage memories 1231~123n.

The buffer memory device 1220 may be configured to temporarily store the data to be stored in the storage memories 1231~123n. Further, the buffer memory device 1220 may be configured to temporarily store the data read from the storage memories 1231~123n. The temporarily stored data in the buffer memory device 1220 may be transmitted to the host device 1100 or the storage memories 1231~123n in accordance with the control of the controller 1210.

The storage memories 1231~123n may be used as a storage medium of the SSD 1200. The storage memories 1231~123n may be connected with the controller 1210 through respective channels CH1~CHn. One channel may be connected to at least one storage memory. In the case of multiple storage memories being connected to a single channel, each such storage memory may be connected to the same signal bus and the same data bus.

The power supply 1240 may be configured to provide the background of the SSD 1200 with a power PWR inputted through the power connector 1260. The power supply 1240 may include an auxiliary power supply 1241. When a sudden power-off occurs, the auxiliary power supply 1241 may provide the power PWR so as to properly shutdown or stop the SSD 1200. The auxiliary power supply 1241 may include bulk capacitors.

The signal connector 1250 may be implemented with any of various connectors depending on the particular interface type being used between the host device 1100 and the SSD 1200.

The power connector 1260 may be implemented with any of various connectors in accordance with the particular power supply type of the host device 1100.

Figure 11:
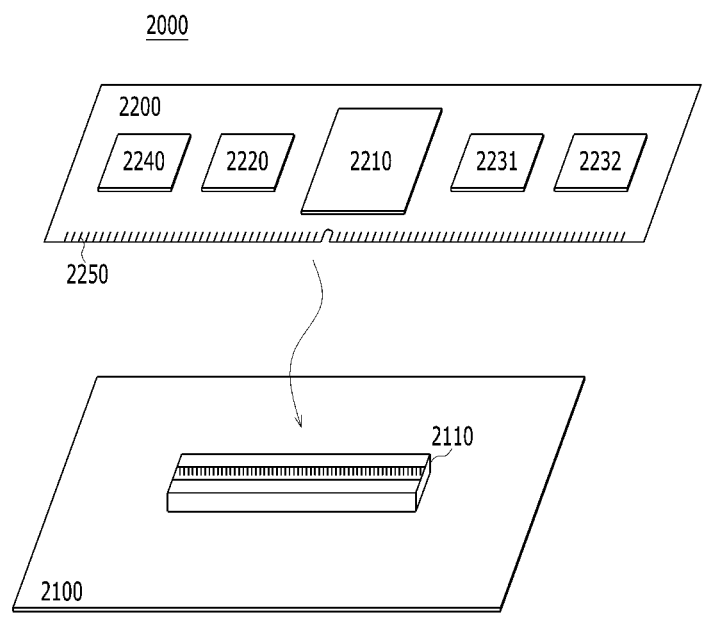
FIG. 11 is a view illustrating a data processing system including a memory system in accordance with embodiments.

FIG. 11 is a view illustrating a data processing system including a memory system in accordance with embodiments.

Referring to FIG. 11, a data-processing system 2000 may include a host device 2100 and a memory system 2200.

The host device 2100 may include a board such as a printed circuit board (PCB). Although not depicted in drawings, the host device 2100 may include background function blocks for performing functions of the host device 2100.

The host device 2100 may include a connection terminal 2110 such as a socket, a slot, a connector, or the like. The memory system 2200 may be mounted on the connection terminals 2110.

The memory system 2200 may include a substrate such as a PCB. The memory system 2200 may be referred to as a memory module or a memory card. The memory system 2200 may include a controller 2210, a buffer memory device 2220, storage memories such as non-volatile memory devices 2231~2232, a power management integrated circuit (PMIC) 2240 and a connection terminal 2250.

The controller 2210 may be configured to control operations of the memory system 2200. The controller 2210 may be configured substantially the same as the controller 1210 in FIG. 10.

The buffer memory device 2220 may be configured to temporarily store data to be stored in the storage memories 2231~2232. Further, the buffer memory device 2220 may be configured to temporarily store data read from the storage memories 2231~2232. The temporarily stored data in buffer memory device 2220 may be transmitted to the host device 2100 or the storage memories 2231~2232 in accordance with controls of the controller 2210.

The storage memories 2231~2232 may be used as a storage medium of the memory system 2200.

The PMIC 2240 may provide the background of the memory system 2200 with a power inputted through the connection terminal 2250. The PMIC 2240 may be configured to manage the power of the memory system 2200 in accordance with the control of the controller 2210.

The connection terminal 2250 may be connected to the connection terminal 2110 of the host device 2100. Signals such as a command, an address, data, and the like, and power may be transmitted between the host device 2100 and the memory system 2200 through the connection terminal 2250. The connection terminal 2250 may have any of various configurations depending on the particular interface type being used between the host device 2100 and the memory system 2200. The connection terminal 2250 may be disposed on or in any side surface of the memory system 2200.

Figure 12:
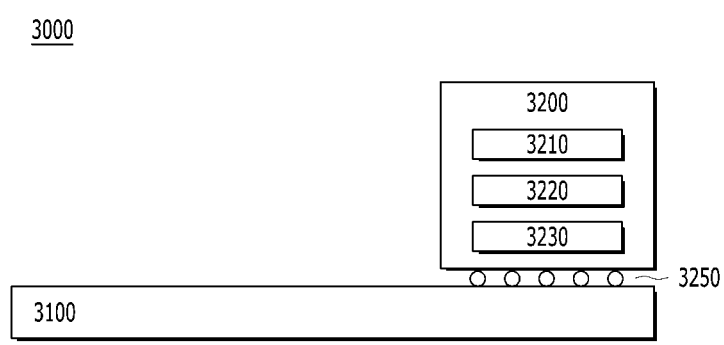
FIG. 12 is a view illustrating a data processing system including a memory system in accordance with embodiments.

FIG. 12 is a view illustrating a data processing system including a memory system in accordance with embodiments.

Referring to FIG. 12, a data-processing system 3000 may include a host device 3100 and a memory system 3200.

The host device 3100 may include a board such as a printed circuit board (PCB). Although not depicted in drawings, the host device 3100 may include background function blocks for performing functions of the host device 3100.

The memory system 3200 may have a surface-mounting type package. The memory system 3200 may be mounted on the host device 3100 through solder balls 3250. The memory system 3200 may include a controller 3210, a buffer memory device 3220, storage and a storage memory 3230.

The controller 3210 may be configured to control operations of the memory system 3200. The controller 3210 may be configured substantially the same as the controller 1210 in FIG. 10.

The buffer memory device 3220 may be configured to temporarily store data to be stored in the storage memory 3230. Further, the buffer memory device 3220 may be configured to temporarily store data read from the storage memory 3230. The temporarily stored data in buffer memory device 3220 may be transmitted to the host device 3100 or the storage memory 3230 in accordance with controls of the controller 3210.

The storage memory 3230 may be used as a storage medium of the memory system 3200.

Figure 13:
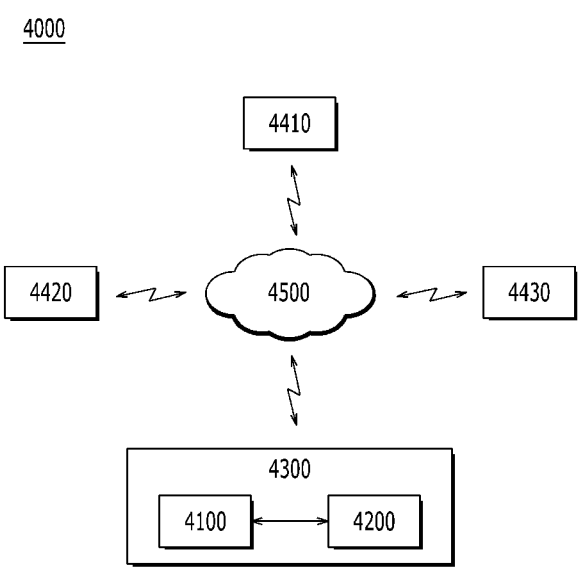
FIG. 13 is a view illustrating a network system including a memory system in accordance with embodiments.

FIG. 13 is a view illustrating a network system including a memory system in accordance with embodiments.

Referring to FIG. 13, a network system 4000 may include a server system 4300 and a plurality of client systems 4410~4430 connected with each other through network 4500.

The server system 4300 may be configured to service data in response to requests of the client systems 4410~4430. For example, the server system 4300 may store data provided from the client systems 4410~4430. Alternatively, the server system 4300 may provide the client systems 4410~4430 with data.

The server system 4300 may include a host device 4100 and a memory system 4200. The memory system 4200 may be substantially the same as the data-processing system 10 in FIG. 1, the SSD 1200 in FIG. 10, the memory system 2200 in FIG. 11 or the memory system 3200 in FIG. 12.

Figure 14:
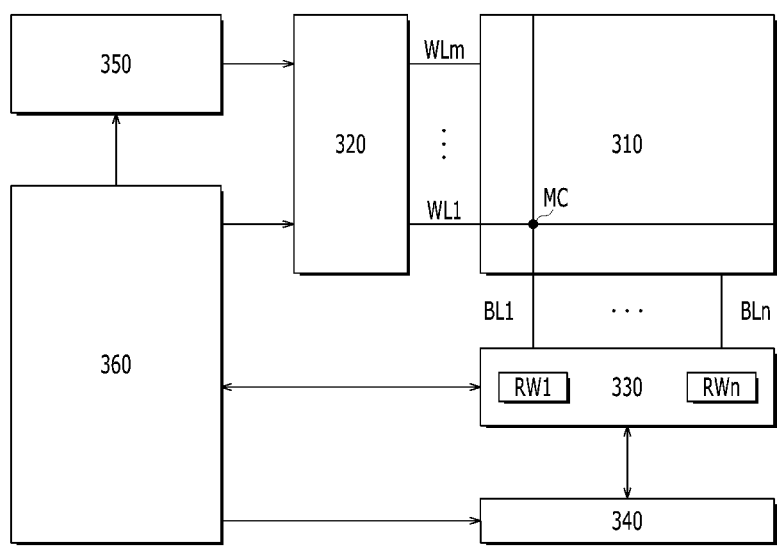
FIG. 14 is a block diagram illustrating a storage memory in a memory system in accordance with embodiments.

FIG. 14 is a block diagram illustrating a storage memory in a memory system in accordance with embodiments.

Referring to FIG. 14, a non-volatile memory device 300 may include a memory cell array 310, a row decoder 320, a data read/write block 330, a column decoder 340, a voltage generator 350 and control logic 360.

The memory cell array 310 may include memory cells MC arranged at intersected points between word lines WL1~WLm and bit lines BL1~BLn.

The row decoder 320 may be connected with the memory cell array 310 through the word lines WL1~WLm. The row decoder 320 may be operated in accordance with controls of the control logic 360. The row decoder 320 may be configured to decode addresses provided from an external device. The row decoder 320 may select and drive the word lines WL1~WLm based on decoded results. For example, the row decoder 320 may provide the word lines WL1~WLm with a word line voltage provided from the voltage generator 350.

The data read/write block 330 may be connected with the memory cell array 310 through the bit lines BL1~BLn. The data read/write block 330 may include read/write block RW1~RWn corresponding to the bit lines BL1~BLn. The data read/write block 330 may be operated in accordance with controls of the control logic 360. The data read/write block 330 may be operated as a write driver or a detection amplifier in different operation modes, respectively. For example, the data read/write block 330 may be operated as a write driver configured to store data provided from the external device in the memory cell array 310 in a program or write mode. Alternatively, the data read/write block 330 may be operated as a detection amplifier configured to read the data from the memory cell array 310 in a read mode.

The column decoder 340 may be operated in accordance with controls of the control logic 360. The row decoder 320 may be configured to decode addresses provided from an external device. The column decoder 340 may connect the read/write blocks RW1~RWn of the data read/write block 330 corresponding to the bit lines BL1~BLn with data input/output lines or data input/output buffers based on the decoded results.

The voltage generator 350 may be configured to generate voltages used for the background operation of the non-volatile memory device 300. The voltages generated by the voltage generator 350 may be applied to the memory cells of the memory cell array 310. For example, a program voltage generated in a program operation may be applied to a word line of the memory cells on which the program operation may be performed. Alternatively, an erase voltage generated in an erase operation may be applied to a well-region of the memory cells on which the erase operation may be performed. Further, a read voltage generated at a read operation may be applied to a word line of the memory cells on which the read operation may be performed.

The control logic 360 may be configured to control operations of the non-volatile memory device 300 based on control signals provided from the external device. For example, the control logic 360 may control the read operation, the write operation and the erase operation of the non-volatile memory device 300.

The disclosed embodiments of the present invention are intended as examples, not to limit the present invention. Various alternatives and equivalents are possible. The invention is not limited by any of the embodiments described herein. Nor is the invention limited to any specific type of semiconductor device. Those skilled in the art will understand that, in view of the present disclosure, various additions, subtractions, and/or modifications may be made, all of which are intended to fall within the scope of the appended claims.

What is claimed is:

1. A multi-chip package for exchange of data with a host, comprising:
   a memory controller configured to output a control signal generated from inside the multi-chip package;
   a storage memory on which a test operation is performed in response to the control signal outputted from the memory controller; and
   a buffer memory on which the test operation is performed in response to the control signal outputted from the memory controller, wherein the test operation is performed on the buffer memory while, or sequentially after, the test operation is performed on the storage memory.

2. The multi-chip package of claim 1, wherein the test operation is performed on a valid memory region of the buffer memory where no data is stored.

3. The multi-chip package of claim 1, wherein the control signal comprises a test mode signal.

4. The multi-chip package of claim 1, wherein the control signal comprises a power-up signal.

5. The multi-chip package of claim 4, wherein the testing operation on the storage memory comprises a Linux kernel test.

6. The multi-chip package of claim 1, wherein the testing operation on the buffer memory comprises at least one of a self-refresh test, a row hammering test, a frequency test, an AC parameter test and a DC parameter test.

7. The multi-chip package of claim 1, wherein the buffer memory comprises a memory cell array including a plurality of memory cells, and the memory cell array is divided into a plurality of test regions on which the test is individually performed.

8. The multi-chip package of claim 1, wherein the storage memory comprises a storage configured to store test results of the test operations performed on the storage memory and the buffer memory.

9. A method of testing a multi-chip package capable of exchanging data with a host, the method comprising:
   testing a storage memory configured to store data in response to a control signal generated from a memory controller inside the multi-chip package;
   determining a valid memory region of a buffer memory configured to temporarily store the data in response to the control signal outputted from the memory controller; and
   testing the valid memory region of the buffer memory in response to the control signal outputted from the memory controller.

10. The method of claim 9, wherein the testing of the valid memory region of the buffer memory is performed simultaneously with the testing of the storage memory.

11. The method of claim 9, wherein the testing of the valid memory region of the buffer memory is sequentially performed after the testing of the storage memory.

12. The method of claim 9, wherein the control signal comprises a test mode signal outputted from the controller.

13. The method of claim 12, wherein the testing of the storage memory comprises:
   programming or erasing data in a memory cell of the storage memory in accordance with a test pattern in response to the test mode signal;
   reading the data in the memory cell; and
   determining whether the reading operation failed.

14. The method of claim 9, wherein the control signal comprises a power-up signal.

15. The method of claim 9, wherein the testing of the buffer memory comprises:
   performing a first test on the valid memory region under a first condition; and
   performing the first test on the valid memory region under a second condition more severe than the first condition.

16. The method of claim 15, wherein the testing of the buffer memory further comprises:
   performing a second test on the valid memory region on which the first test is completed under the first condition; and
   performing the second test on the valid memory region under the second condition.

17. The method of claim 16, wherein the first and second tests comprise at least one of a self-refresh test, a row hammering test, a frequency test, an AC parameter test and a DC parameter test.

18. The method of claim 9, wherein the valid memory region of the buffer memory is divided into a plurality of test regions on which the test is individually performed.

19. A multi-chip package for exchange of data with a host and including a memory controller, a storage memory and a buffer memory, wherein:
   the memory controller is configured to provide the storage memory and the buffer memory with an enabled control signal generated from inside the multi-chip package for testing both the storage memory and a valid memory region of the buffer memory while the storage memory and the buffer memory are operated; and
   the memory controller is configured to disable the control signal after the testing of the storage memory and the valid memory region of the buffer memory.

20. An operating method of a memory system for exchange of data with a host, the operating method comprising testing, in series or in parallel, a non-volatile memory device and a volatile memory device of the memory system according to a single trigger signal issued by a memory controller of the memory system, wherein the single trigger signal is generated from inside the memory system,
   wherein the testing includes testing a valid region of the volatile memory device.

21. The method of claim 20, wherein the valid memory region of the buffer memory is divided into a plurality of test regions on which the testing is individually performed.

* * * * *